United States Patent
Lekarski

(10) Patent No.: US 12,374,470 B2
(45) Date of Patent: Jul. 29, 2025

(54) MULTILAYER ELECTRICALLY CONDUCTIVE WIRE HAVING GRAPHENE LAYERS

(71) Applicant: SAFRAN ELECTRONICS & DEFENSE, Paris (FR)

(72) Inventor: Kyril Lekarski, Moissy Cramayel (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 415 days.

(21) Appl. No.: 17/557,760

(22) Filed: Dec. 21, 2021

(65) Prior Publication Data

US 2022/0199280 A1    Jun. 23, 2022

(30) Foreign Application Priority Data

Dec. 22, 2020 (FR) ........................................ 2013887

(51) Int. Cl.
*H01B 1/04*    (2006.01)
*H01B 13/016*    (2006.01)

(52) U.S. Cl.
CPC ........... *H01B 1/04* (2013.01); *H01B 13/0165* (2013.01)

(58) Field of Classification Search
CPC ............................ H01B 1/04; H01B 13/0165
See application file for complete search history.

(56) References Cited

U.S. PATENT DOCUMENTS

| | | | |
|---|---|---|---|
| 2011/0088931 A1* | 4/2011 | Lettow | D21H 19/10 428/476.3 |
| 2012/0125656 A1* | 5/2012 | Wei | H01B 1/04 |
| 2012/0298396 A1* | 11/2012 | Hong | H01B 1/04 977/734 |
| 2015/0255184 A1* | 9/2015 | Li | H01L 21/56 427/122 |
| 2015/0262726 A1* | 9/2015 | Lee | H01B 1/04 174/126.2 |
| 2015/0262731 A1* | 9/2015 | Lee | H01B 1/04 174/118 |
| 2016/0057544 A1* | 2/2016 | Chamarthy | H04R 9/046 381/410 |
| 2017/0154701 A1 | 6/2017 | Lee et al. | |

(Continued)

FOREIGN PATENT DOCUMENTS

| | | | |
|---|---|---|---|
| KR | 20120099917 A | * | 9/2012 |
| KR | 20160104502 A | * | 9/2016 |
| WO | WO 2014/116258 A1 | | 7/2014 |

OTHER PUBLICATIONS

Search Report as issued in French Patent Application No. 2013887, dated Sep. 17, 2021.

(Continued)

*Primary Examiner* — Jeffrey T Carley
*Assistant Examiner* — Jose K Abraham
(74) *Attorney, Agent, or Firm* — Pillsbury Winthrop Shaw Pittman LLP

(57) ABSTRACT

A multilayer electrically conductive wire includes a central support core, and a set of pairs of layers each including at least one intercalary layer made of a non-carbon material, wherein the first layer of the first pair of layers is deposited on the outer surface of the central core and the first layer of the N+1 pair of layers is deposited on the second layer of the N pair of layers such that each graphene layer of each N pair is separated from another graphene layer of another pair of layers by an intercalary layer of another non-carbon based material.

8 Claims, 5 Drawing Sheets

(56) References Cited

U.S. PATENT DOCUMENTS

| | | |
|---|---|---|
| 2018/0102197 A1 | 4/2018 | Adams |
| 2018/0122529 A1* | 5/2018 | Hwang ............... H01B 7/0009 |
| 2018/0269660 A1* | 9/2018 | Dal Re ............... H01F 27/2823 |
| 2018/0330842 A1 | 11/2018 | Rastogi et al. |
| 2019/0066879 A1* | 2/2019 | Adams ................ C23C 16/545 |
| 2019/0150289 A1* | 5/2019 | Hunt ..................... G06F 1/183 |
| | | 361/679.31 |
| 2020/0135357 A1* | 4/2020 | Won ....................... H01B 1/02 |

* cited by examiner

[Fig. 1]
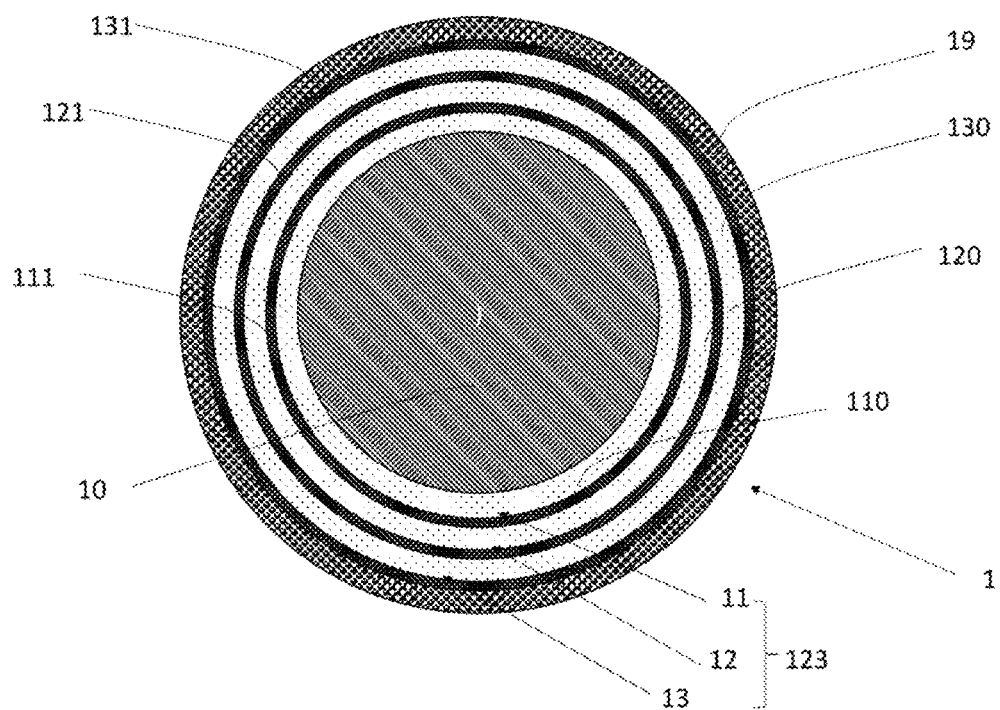

[Fig. 2]
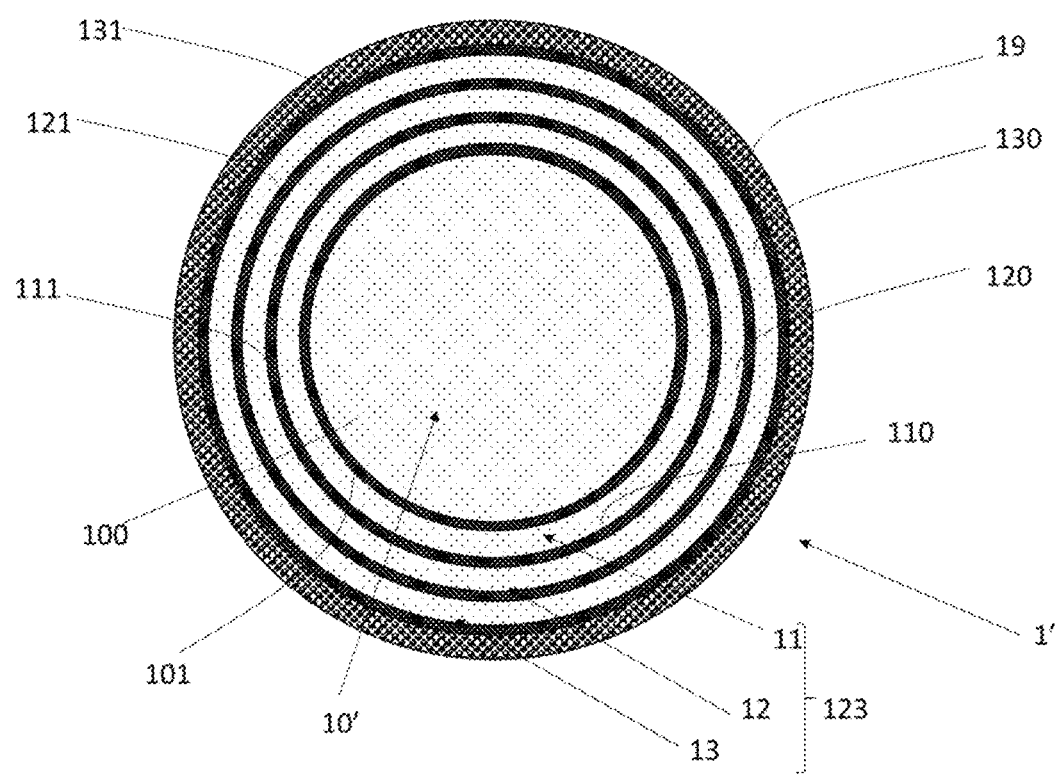

[Fig. 3]
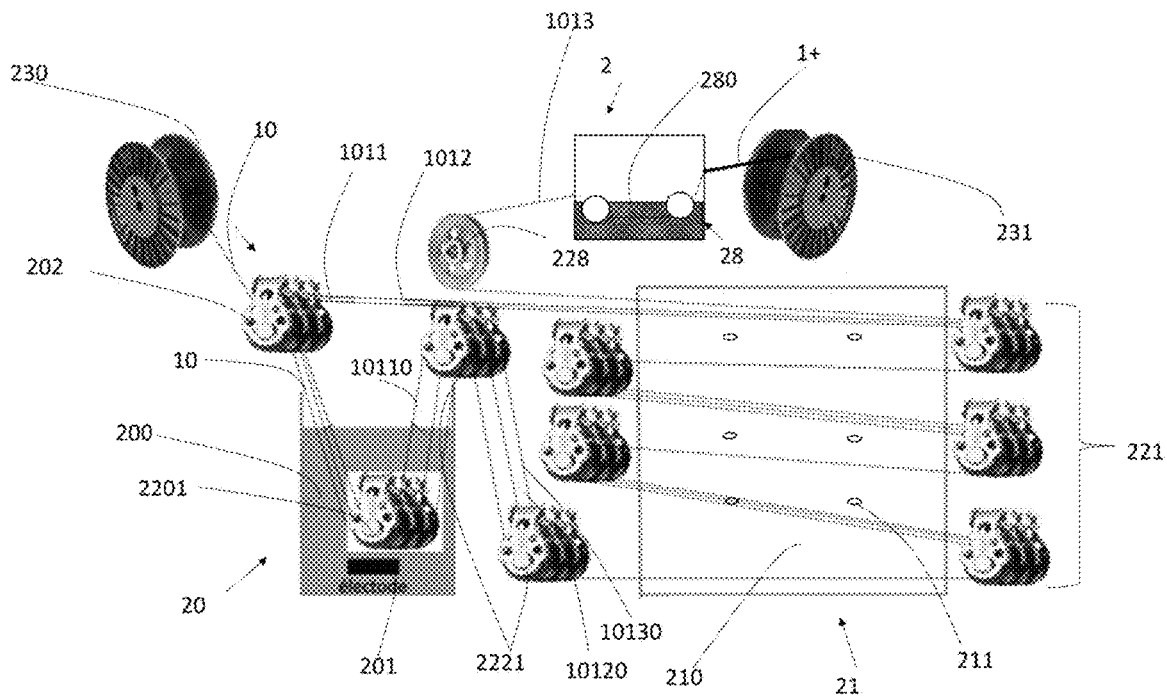
[Fig. 4]
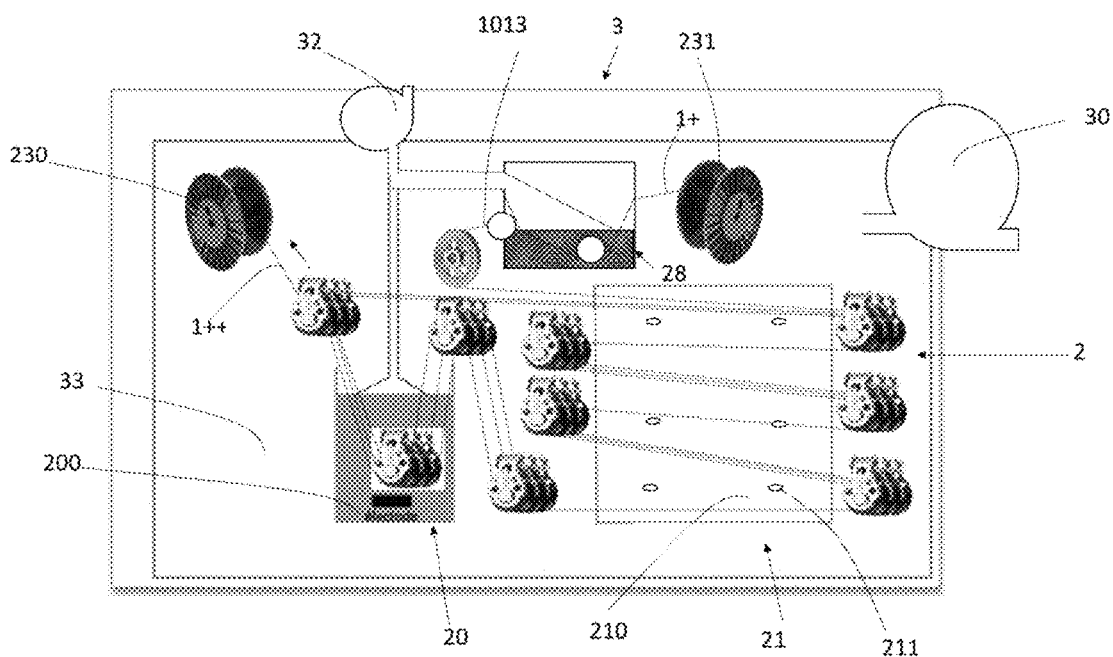

[Fig. 5]
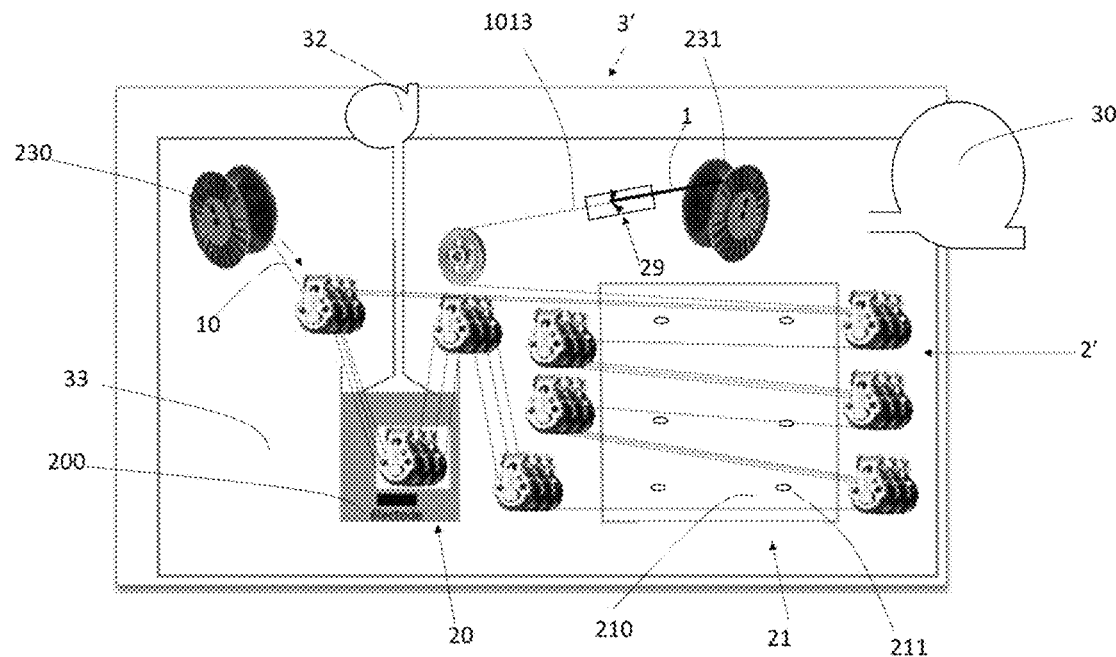
[Fig. 6]
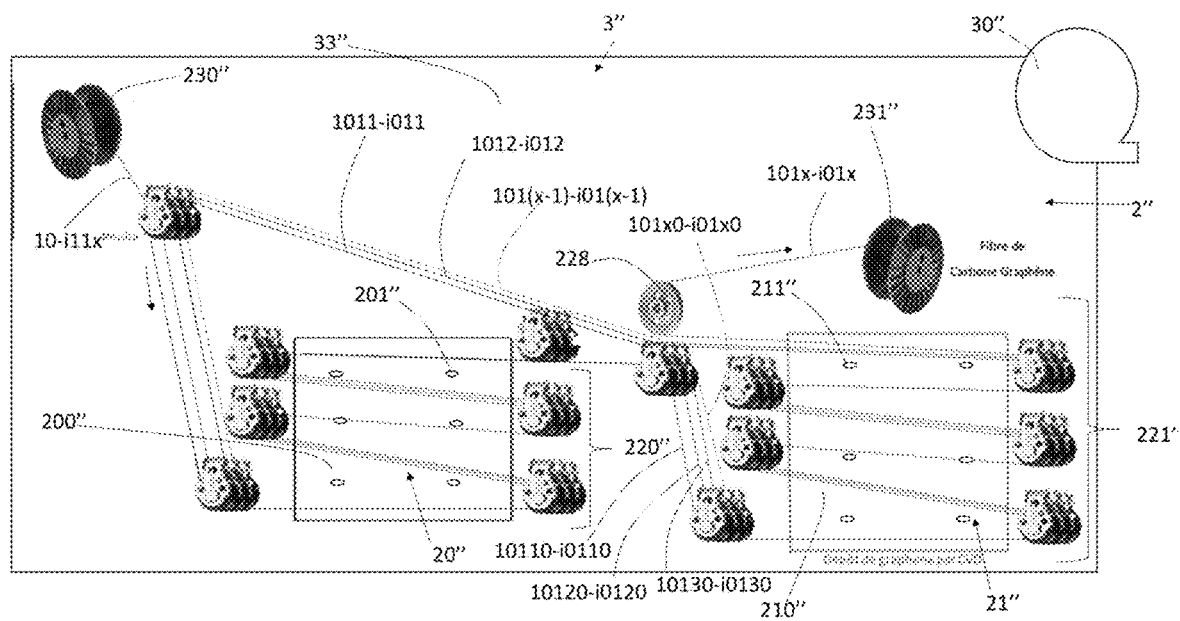

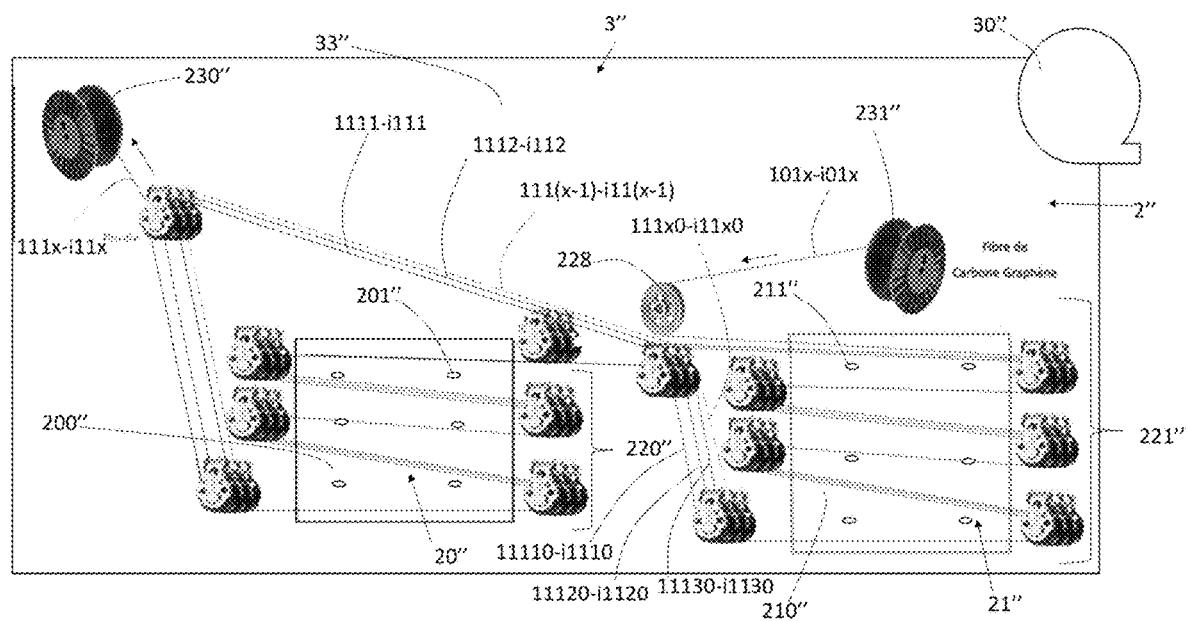
[Fig. 7]

MULTILAYER ELECTRICALLY CONDUCTIVE WIRE HAVING GRAPHENE LAYERS

CROSS-REFERENCE TO RELATED APPLICATIONS

This application claims priority to French Patent Application No. 2013887, filed Dec. 22, 2020, the entire content of which is incorporated herein by reference in its entirety.

FIELD

The technical field of the invention is that of electrically conductive wire. The present invention relates to a multilayer electrically conductive wire having graphene layers.

BACKGROUND

A conventional wire is made of copper having high electrical conductivity. Aluminium wires having higher resistivity at iso-section but lower weight also exist.

Copper enables current to flow easily and to emit little heat on account of its low resistivity.

Further, copper has the advantage of easy manufacture due to its ductility and its high tensile strength. In terms of electrical conductivity, aluminium cannot replace copper on account of its low electrical conductivity, and silver, having a higher electrical conductivity, cannot replace copper on account of its high cost.

Electric wires comprising carbon nanotube filaments are also known.

Electric wires are also known having a copper inner-core and a single graphene layer on the copper inner-core but these electric wire do not have sufficient gain and do not make it possible to increase significantly the performance with respect to the construction price due to the graphene layer to produce. Further, these graphene based conductive wires do not make it possible to decrease considerably the weight of the conductor compared to its total copper equivalent at electrical iso-conductance. There exists a need, in particular in the aeronautics field, due to the numerous electrically conductive wires, to decrease by at least two times the weight×section/conductivity ratio while having a satisfactory cost with respect to the gain of the ratio. Such a conductive wire makes it possible, for example, to lighten the airplane while keeping or while improving conductivity compared to a conductive copper wire at iso-section. Finally, it is desirable to obtain a conductive wire that can replace another conductive wire of the prior art.

SUMMARY

The invention offers a solution to the aforementioned problems, by making it possible to have an electric wire of which the weight at iso-conductivity is lower or at iso-weight the conductivity is improved while optimising the manufacturing cost.

One aspect of the invention relates to a multilayer electrically conductive wire comprising:
- a central support core,
- a set of pairs of layers around the central core each comprising at least one intercalary layer made of a non-carbon based material and a graphene layer, wherein the first layer of the first pair of layers is deposited on the outer surface of the central core enveloping the outer surface of the central core and the first layer of the $N+1^{th}$ pair of layers is deposited on the second layer of the $N^{th}$ pair of layers, in such a way as to separate each graphene layer from another graphene layer by one of the intercalary layers.

Thanks to the invention, the conductive wire comprises a multitude (at least two) of graphene layers thus making it possible to improve the characteristics of the electric wire and notably the weight x section/conductivity ratio. Indeed, at iso-section, and iso-length, the weight of a conductive wire comprising pairs of layers, is less compared to a conductive wire made only of copper. For example, a conductive wire having an outer diameter of 0.5 mm comprising a carbon fibre core of 0.468 mm diameter and pairs of layers thus representing around 6% of the diameter, for example constituted of 2500 pairs of layers of which the intercalary layer is made of copper (which is a material enabling chemical deposition of graphene), has a weight saving of around 61% compared to a conductive wire of 0.5 mm outer diameter entirely made of copper while having the same resistivity (around 0.288 ohms/m). Further, the fact of adding an intercalary layer made of a non-carbon material on a graphene layer makes it possible to physically insulate the graphene layers so that they each conserve their thickness and their optimal properties notably to maximise their conductivity. Further, the electrical resistance temperature variation curve of graphene compensates that of the intercalary layers and thus the thermal conductivity of graphene (for example, that of a graphene monolayer obtained by CVD on copper is around 2500 W/m K) reinforces that of the intercalary metal. Finally, the mechanical strength of graphene reinforces the electric wire compared to an electric wire entirely made of intercalary metal, for example copper. This reinforcement thus makes it possible to protect the intercalary layers and the core. During the use of the multilayer electric wire, in particular if the intercalary layer is electrically insulating, the ends could be soldered in order to improve the electrical conductivity of each layer.

Non-carbon based material is taken to mean a material having a carbon free base or a material based on a chemical element different from that of the graphene layer i.e. different from carbon. Material based on an element or on a matter is taken to mean that the main element or matter of the material is the matter or element having the highest percentage.

The core makes it possible to form a support making it possible to produce the different layers coating the preceding layer or the core in the case of first layer. The coating makes it possible to have 360° layers on the preceding layer or core.

The fact of having layers that surround a layer or a core having a geometric shape enables better distribution of the forces in the event of torsion and reduces very considerably the risks of delamination, which would harm the integrity of the conductor. This is all the truer with a cylindrical shape. Indeed at iso-layer and iso-width of layer, the simple superposition of layers would form a strip comprising different layers much wider than thick. A strip would be mechanically much less exploitable on account of its extreme fragility (storage and industrial application). For example, a wire comprising layers coated one on the other makes it possible to produce a twisted wire for manufacturing multistrand conductors which is impossible in the case of a strip.

The coating makes it possible to have a conductor having a "coated" shape which enables the use of pulleys and coils implemented in a method thus making it possible to enhance the efficiency of the manufacturing method. Indeed, running through multiples pulleys and coils makes it possible to enhance the efficiency of the manufacturing method. Furthermore, the central core is a wire which makes it possible to initiate the manufacture by beginning by starting the whole progress of the method.

Further, for example in an embodiment, the shape is cylindrical or rectangular, this enables conduction around a neutral core from a magnetic viewpoint and enables propagation of hyperfrequency electromagnetic waves.

The use of a central core further makes it possible to increase the diameter of the first layers to deposit and to reach the desired conductivity more rapidly while reducing the number of layers and the cost while conserving very good mechanical characteristics. Further, the central core makes it possible to decrease the number of layers and thus the manufacturing cost.

No efficient industrial method able to manufacture conductive wire with different layers of graphene capable of being used as a replacement for copper wire in its electrical applications exists. Indeed, conductors comprising vertically superimposed graphene layers (without coating) do not make it possible to replace wires of the prior art and do not have a method for industrially manufacturing a wire as a substitution for the best industrialised conductive wires. The invention allow to replace the copper wire in its electrical applications.

An aspect of the invention also relates to a multilayer electrically conductive wire comprising:
 a central support core,
 a base of multilayers deposited on the core, the base of multilayers comprising at least two alternations of an intercalary layer made of non-carbon based material and a graphene layer deposited on the intercalary layer.

Apart from the characteristics that have been mentioned in the preceding paragraph, the electric wire according to one aspect of the invention may have one or more complementary characteristics among the following, considered individually or according to all technically possible combinations thereof:

According to an embodiment, the material of the intercalary layer is non-carbon material. In other words, the material of the intercalary layer is totally exempt of carbon.

According to an embodiment, the graphene layer is classed as monolayer (perfect 2D graphene) i.e. a thickness by definition of one atom, i.e. 0.3 nanometres.

According to an embodiment, the graphene layer is classed as "few-layer graphene" i.e. at the most a thickness of layers of 2 to 10 carbon atoms, for example a thickness of around 2.5 nanometres.

According to another embodiment, the graphene layer has a maximum thickness of 100 atom layers, called "graphene nanoplatelets".

According to an embodiment, the intercalary layer is produced by a coating method.

According to an example, the coating method is carried out by chemical deposition, for example by electrolysis (electrochemical) or by chemical deposition from a vapour phase for example Chemical Vapour Deposition (CVD) or Physical Vapour Deposition (PVD). This makes it possible to have an intercalary layer of low thickness compared to other surface coating deposition methods such as physical deposition by projection or immersion in a bath of the material in the liquid state.

According to an embodiment, the intercalary layer has a thickness less than 1 micrometre or even less than 0.1 micrometre. According to an example, the intercalary layer has a thickness between 5 and 50 nanometres, for example 10 nanometres. Indeed, the lower the thickness of the intercalary layer, the lower the weight of the wire and further this can make it possible for a desired diameter to have a larger core and thus to decrease the number of layers and thus the manufacturing cost. Further, this makes it possible, at iso-diameter, to decrease the weight of the wire when the intercalary layer is made of a material having a density greater than that of the core, for example an intercalary layer made of copper and the core made of carbon. Indeed, for an intercalary material with high density, the lower the thickness of the intercalary layer, the lower the density of the wire. In other words, it is possible to have a weight saving, which is sought, while decreasing the number of pairs of layers and thus the cost of the method.

According to an embodiment, the material of the intercalary layer is an electrically conductive metal material. This makes it possible to improve the overall conductivity of the multilayer electric wire while making it possible to deposit the intercalary layer by an electrolysis type method and thus to obtain easily an intercalary layer of thickness comprised between 0.01 micrometres and 1 micrometre, i.e. a very small thickness compared to another method, for example extrusion, bath, etc. Thus, at iso-conductivity and iso-diameter compared to a copper conductor, the multilayer electrically conductive wire will comprise a core lighter than copper enabling the multilayer electrically conductive wire to be much lighter than that of copper. At iso-weight and iso-diameter compared to a copper conductor, the multilayer electrically conductive wire may comprise a conductive core and the conductivity will be improved compared to the copper conductor.

According to an embodiment, the section of the multilayer electrically conductive wire is of circular shape. The core, the intermediate layers and the graphene layers may thus be circular. This shape of section makes it possible to have uniform flexibility of the wire to facilitate its installation.

According to an example of this embodiment, the multilayer electrically conductive wire of cylindrical shape comprises a cylindrical insulating core. Such a geometry thus has the conductive part of the conductor in tube shape which favours the waveguide effect of which the frequency will be adapted to the diameter of the conductor. Indeed, the great mobility of electrons in graphene improves the frequency response of the electric wire compared to a copper wire. In this case of usage, the diameter of the conductor is dimensioning vis-à-vis the cut-off frequency of the waveguide.

According to another embodiment, the section of the multilayer electrically conductive wire core is of rectangular shape. The core, the intermediate layers and the graphene layers may thus be rectangular. This section makes it possible to increase the level of conductor in a slot of an electric machine compared to a circular shape.

According to an embodiment, the multilayer electrically conductive wire comprises a final outer layer made of an electrical insulator. The electrical insulator may be a polymer for example an enamelling varnish or an insulating sheath for example made of elastomer (polyethylene (PE) for example) or a rubber (ethylene propylene rubber (EPR) for example).

According to an embodiment, the intercalary layer made of metal material of each $N+1^{th}$ pair of layers, has been formed by electrodeposition on the graphene layer of the $N^{th}$ pair of layers. The electrodeposition of the intercalary layer on the graphene enables the deposition of the intercalary layer on the outer surface of the conductive wire being manufactured, according to a low thickness to physically insulate two graphene layers easily without damaging the graphene. The electrodeposition method makes it possible to adapt to the shape of the wire, for example cylindrical or rectangular, and further to control the thickness of the deposition of conductive metal by the strength of the current and the duration of the passage in the bath comprising an electrolytic solution.

According to an embodiment, the graphene layer of each pair of layers is produced by a chemical vapour deposition (CVD) method, notably pulsed. Such an application of graphene is easily useable because the graphene is manufactured and deposited on the wire forming the graphene layer in a single step to eliminate industrial problems. Further, this method offers good quality of monolayer graphene produced (thickness and homogeneity). Further, the chemical vapour deposition (CVD) method adapts to the shape, for example cylindrical, of the wire. The material of the intercalary layer is thus a material enabling chemical vapour deposition of graphene.

The fact that the intercalary layer is a material enabling chemical vapour deposition of graphene makes it possible to simplify the deposition of graphene while reducing the manufacturing cost due to the multiplication of graphene layers.

According to an embodiment, the core is made of carbon, notably carbon fibre or carbon nanotube fibre.

According to an example of this embodiment, the section of the core is comprised between 90 and 98% of the section of the conductive wire. At iso-conductivity, this makes it possible to reduce the weight of the multilayer conductive wire compared to a wire made completely of copper. Indeed, the core has a density less than that of copper and the number of graphene layers separated from each other by the intercalary layers making it possible to realise the major part of the conductivity of the multilayer wire whether the intercalary layers are made of a conductive material or not.

According to another alternative embodiment of the preceding embodiment, the core comprises:
   an electrically conductive metal inner-core, notably made of copper
   a graphene layer deposited on the conductive inner-core, coated by the intercalary layer of the first pair of layers.

According to an example of this embodiment, each intercalary layer is made of the same material as that of the inner-core of the central core. This makes it possible to use the same device for the deposition of graphene whether it is on the core or on the intercalary layer.

According to an embodiment, the intercalary layer is made of a material deposited by the same deposition method as that of the intercalary layer. This makes it possible to use the same device for the deposition of the two layers, whether intercalary or graphene. For example, the method is carried out by chemical vapour deposition (CVD). This makes it possible to deposit an intercalary layer made of a material having a mass volume density less than that of a material deposited by electrolysis and thus to decrease the weight. Further, this can make it possible to decrease the thicknesses of layers compared to deposition by electrolyse and thus to also decrease the weight. The intercalary layer may thus be made of an electrically and physically insulating material, in this case the ends of the conductive wire are soldered making it possible to place in parallel all the graphene layers to decrease the electrical resistivity.

According to an embodiment, at least one intercalary layer is made of copper. According to an example, all the intercalary layers are made of copper.

According to an embodiment, at least one intercalary layer is made of aluminium. According to an example, all the intercalary layers are made of aluminium.

According to an embodiment, at least one intercalary layer is made of iron. According to an example, all the intercalary layers are made of iron. Iron makes it possible to carry out depositions by electrodeposition that are thinner and more compact than copper (less than 10 nanometres) and thus to decrease the weight of an intercalary layer compared to the weight of a copper intercalary layer, and further it is inexpensive compared to copper. According to an example, the final layer of the conductive wire is made of a material other than iron. This makes it possible to avoid oxidation, for example if the final layer is an intercalary layer it may be made of copper.

According to an embodiment, at least one intercalary layer is made of silicon oxide (SiOx). This material makes it possible to lighten the wire, indeed, it is between 11 and 35 times lighter than copper and further is more flexible. A carbon/graphene wire produced with this type of intercalary material makes it possible to be able to be 20% lighter than with the example of an intercalary layer made of copper and five times lighter than a solid copper wire (without multilayers).

According to an example of this embodiment, the intercalary layers are made of silicon oxide (SiOx). For example, they are deposited by chemical vapour deposition (CVD) on the graphene layers.

According to an embodiment, the multilayer electrically conductive wire is destined for aircraft.

Another aspect of the invention relates to a cable comprising several multilayer electrically conductive wires according to the invention, twisted together, and an insulating layer over the set of twisted multilayer electrically conductive wires. This makes it possible to increase the current accepted by the cable.

Another aspect of the invention relates to a method for manufacturing a multilayer electrically conductive wire according to any of the preceding features, comprising a method for depositing pairs of layers of a conductive wire being manufactured comprising the steps of:
   unwinding a conductive wire under construction comprising at least one central core from a first coil,
   depositing at least two successive pairs of layers around the central core, comprising for each deposition of a pair of layers:
      a first sub-step of inserting the conductive wire under construction into a device for depositing a coating of an intercalary layer made of a non-carbon based material,
      a second sub-step of continuously inserting a portion of the conductive wire being manufactured, comprising on the outer surface the intercalary metal layer deposited in the first preceding sub-step, into a chamber for chemical vapour deposition (CVD) of graphene in which gas comprising carbon is introduced and in which is deposited a graphene layer on the outer surface of the intercalary layer,
   winding the multilayer conductive wire having at least two pairs of layers around a second coil.

According to an embodiment, the device for depositing a coating is an electrodeposition device and the first sub-step comprises a step of continuously immersing a portion of the conductive wire being manufactured in an electrolysis bath, in which a metal of an electrode in the electrolysis bath migrates and is deposited on the outer surface of the metal wire being manufactured forming the intercalary layer.

According to an example of this embodiment, the method further comprises a step of evaporation after the deposition of the intercalary layer. This makes it possible to eliminate electrolyte from the conductive wire before the second sub-step of depositing graphene by CVD.

According to an example of this embodiment, the method further comprises a step of cleaning the intercalary layer before insertion into a chemical vapour deposition chamber.

According to an example of this embodiment, the electrolysis bath comprises an electrolytic solution containing acid. This makes it possible to multiply the ions and thus the strength of the current brought into play during electrolysis. According to an example, the electrolytic solution comprises less than 75% of sulphuric acid. This allows the graphene layer to withstand the electrolysis for the deposition of the intercalary layer of another pair of layers on this graphene layer.

The electrolytic solution may also be an acid copper sulphate solution for example.

According to an alternative of this embodiment, the device for depositing a coating is a chemical vapour deposition device, and in that the first sub-step of inserting the device comprises the insertion of the portion of wire into a chemical vapour deposition (CVD) chamber in which gas comprising non-carbon based material is introduced and in which is deposited an intercalary layer on the outer surface of the core or the graphene layer.

According to an example of this embodiment, the device for chemical vapour deposition of graphene and the device for chemical vapour deposition of the non-carbon based material are adaptable and complementary in order to make it possible to reverse the gases to inject into their chamber. That is to say that the two devices for chemical vapour deposition of graphene can inject, into their chamber, a gas comprising either graphene or non-carbon based material.

According to an example of this embodiment, the material of at least one intercalary layer deposited by CVD is silicon oxide (SiOx). This material makes it possible to lighten the wire, in fact it is between 11 and 35 times lighter than copper and further is more flexible. A carbon/graphene wire made with this type of intercalary material makes it possible to be 20% lighter than with the example of copper intercalary layer and five times lighter than a solid copper wire (without multilayers).

According to an embodiment, the method for manufacturing a multilayer electrically conductive wire comprises several times the method for depositing pairs of layers of a conductive wire being manufactured.

According to an embodiment, the method for depositing pairs of layers of a conductive wire being manufactured is reversible, wherein, when the step of winding the second coil is finished, the reversible method for depositing pairs of layers of a conductive wire being manufactured comprises a step of unwinding the conductive wire being manufactured from the second coil, the step of depositing at least two successive pairs of layers around the central core and winding the conductive wire being manufactured simultaneously onto the first coil.

According to an example, during the step of unwinding the conductive wire being manufactured from the second coil to the winding of the conductive wire being manufactured simultaneously onto the first coil, the nozzles of the chamber for chemical vapour deposition (CVD) of graphene for the first passage in the direction of unwinding from the second coil to the first coil are stopped. This makes it possible that during the first passage of the conductive wire being manufactured in the chamber, the graphene layer receives the least possible carbon in order to ensure that this layer conserves the properties of graphene. The chamber for chemical vapour deposition (CVD) of graphene may have a wall, for example vertical, between the other passages and the final passage of the conductive wire in the direction from the first coil to the second coil in order not to depose two layers of graphene one on the other.

According to another example, the method for depositing pairs of layers of a conductive wire being manufactured in reversible mode comprises, between the final passage in the chamber for chemical vapour deposition (CVD) of graphene and the winding, a step of depositing an intercalary coating. According to an example, the intercalary coating is an intercalary layer derived from the same coating deposition method. This makes it possible, when unwinding in the direction from the second coil to the first coil, not to superimpose two graphene layers during the first passage of the wire in the chemical vapour deposition (CVD) chamber.

Another aspect of the invention relates to a production line for the manufacture of a multilayer electrically conductive wire, comprising:
  a first device for unwinding/winding a first coil comprising in the initial state the central core,
  a device for depositing a coating of intercalary layers made of a non-carbon based material
  a device for chemical vapour deposition (CVD) of graphene, comprising a chamber and at least one nozzle for injecting a gas comprising carbon into the chamber for depositing a graphene layer on the intercalary layer.

According to an embodiment, the device for depositing a coating and an electrodeposition device comprises:
  a bath of electrolytic solution of a metal,
  an anode electrode made of metal to deposit for manufacturing the intercalary layer,
  a cathode electrode connected to the electrically conductive wire being manufactured.

According to an embodiment, the production line comprises:
  pulleys making it possible to guide the conductive wire being manufactured several times in turn into the electrolysis bath and into the chamber for chemical vapour deposition (CVD) of graphene, and
  a second device for winding/unwinding from a second coil drawing/unwinding the conductive wire being manufactured by unwinding the core and by passing through the pulleys to produce X times the pairs of layers in the electrolysis bath and the chemical vapour deposition chamber.

This embodiment of production line makes it possible to reuse the electrodeposition device and the device for chemical vapour deposition (CVD) of graphene for producing the set of layers and thus to decrease the manufacturing costs of the multilayer conductive wire.

According to an embodiment, the production line comprises a reversible direction of winding/unwinding. This embodiment of production line makes it possible to reuse the production line in the other direction thus using the electrodeposition device and the device for chemical vapour deposition (CVD) of graphene for producing the set of pairs of layers and thus to decrease the time and the costs of manufacturing the multilayer conductive wire.

According to an embodiment, the device for chemical vapour deposition (CVD) of graphene comprises forwards-backwards pulleys to enable during the second sub-step that the conductive wire under construction passes several times in the chemical deposition chamber in order to deposit and form the graphene layer. This makes it possible to have a less voluminous chemical deposition chamber.

According to an example, the ratio of the length of wire in the chamber of the device for chemical vapour deposition (CVD) of graphene during deposition of the graphene layer over the length of the wire in the chamber of the device for depositing a coating during deposition of an intercalary layer is equal to the ratio of the production time of the graphene layer over the production time of the intercalary layer by the coating deposition device. This makes it possible to have a continuous production by adapting to the production time of the intercalary layer (takt time), notably if it is carried out by electrolysis. Indeed, electrodeposition of the intercalary layer on the graphene layer at iso-length is faster than the chemical vapour deposition (CVD) of the graphene layer on the intercalary layer.

According to an embodiment, the device for chemical vapour deposition (CVD) of graphene comprises several nozzles on the perimeter of the conductive wire for injecting gas comprising carbon into the chamber. For example, the gas is methane, which is decomposed in the chamber at 1,000° C. under vacuum. This makes it possible to improve the uniformity of growth of graphene on the intercalary layer. The carbon atoms adsorbed on the surface after decomposition of the methane reorganise into graphene according to a surface process. Indeed, for example during synthesis on copper Cu, the injection of methane $CH_4$, for example $^{12}CH_4$, leads to the formation of graphene, in this case in this example $^{12}C$. This forms a surface deposition mechanism for $^{12}C$ carbon atoms. The carbon atoms not diffusing, or diffusing very little, in the volume of Cu on account of the too low solubility. This surface process favours the growth of monolayer graphene because once the surface of copper has been covered with the first graphene layer, the copper surface loses its catalytic power and limits the rate of formation of the upper layers.

Another aspect of the invention relates to an apparatus for the manufacture of a multilayer electrically conductive wire comprising:
- a negative pressure chamber comprising a pressure less than atmospheric pressure, for example less than 15 millibars,
- a production line for the manufacture of a multilayer electrically conductive wire of the invention housed in the negative pressure chamber and
- an exhaust hood traversing the negative pressure chamber up to the electrolysis bath to draw off gases during electrolysis.

According to an example, the negative pressure chamber is suitable for obtaining a pressure between 0.6 millibars and 1 millibar. The lower the pressure, the more the rate of diffusion D (graphene deposition rate) of the device for chemical vapour deposition (CVD) of graphene can be increased.

Another aspect of the invention relates to an electric machine of a turbomachine in the aeronautics field comprising a multilayer conductive wire according to the invention described previously.

Such an electric machine for the aeronautics field has the benefit of being able to use existing devices and services for monitoring composite structures very present in the field.

Another aspect of the invention relates to an aircraft comprising a turbomachine and electric cables comprising at least one multilayer conductive wire according to the invention described previously.

Another aspect of the invention relates to a mesh for protecting against lightning comprising the multilayer electrically conductive wire to form a faraday cage of an airplane.

Another aspect of the invention relates to an airplane comprising a fuselage or/and wings made of composite material and a mesh, according to the invention described previously, electrically connected to the composite material of the fuselage or/and the wings. This enables the composite material to have a conductivity making it possible to withstand lightning. For example, the mesh is incorporated in or on the wall of the fuselage or/and the wings thus making it possible to be associated with a ground take-up for protection against lightning. Such a multilayer conductive wire will make it possible to reduce weight and to retain the interest of airplanes made of composite material which will confer on the composite material the conductivity necessary to withstand lightning.

This makes it possible to use existing devices and services for monitoring composite structures very present in the aeronautics field.

The invention and the different applications thereof will be better understood on reading the description that follows and by examining the figures that accompany it.

BRIEF DESCRIPTION OF THE FIGURES

The figures are presented for indicative purposes and in no way limit the invention.

FIG. 1 shows a schematic representation of a cross-section of a multilayer electrically conductive wire according to a first embodiment of the invention.

FIG. 2 shows a schematic representation of a cross-section of a multilayer electrically conductive wire according to a second embodiment of the invention.

FIG. 3 shows a schematic representation of a production line for the manufacture of a multilayer electrically conductive wire.

FIG. 4 shows a schematic representation of an apparatus comprising the production line of FIG. 3 under vacuum for the manufacture of a multilayer electrically conductive wire.

FIG. 5 shows a schematic representation of an apparatus under vacuum comprising another example of production line than that of FIG. 3 for the manufacture of a multilayer electrically conductive wire.

FIGS. 6 and 7 show a schematic representation of an apparatus under vacuum comprising another example of production line than those of FIGS. 3 to 5 for the manufacture of a multilayer electrically conductive wire.

DETAILED DESCRIPTION

The figures are presented for indicative purposes and in no way limit the invention.

FIG. 1 shows a schematic representation of a cross-section of a multilayer electrically conductive wire 1 according to a first exemplary illustration of a first embodiment of the invention.

The multilayer conductive wire 1 comprises a central support core 10 for a set 123 of layers coated one on the other forming the multilayer conductive wire. The central core 10 is in an embodiment electrically conductive. In this embodiment, the central core 10 is made of carbon, for example carbon fibre or according to another example carbon nanotube fibre. In this example, the section of the central core 10 is a disc. The core 10 is thus cylindrical but could be another shape, for example having a section of parallelepiped shape (for example a rectangular section).

In this first example and a second example similar except for the number of pairs of layers, the section of the core is around 0.172 mm$^2$, i.e. a diameter of 0.468 millimetres.

The multilayer conductive wire 1 thus comprises thus a set 123 of X pairs of conductive layers 11, 12, 13, in this case in this first exemplary illustration X=3 to simplify the representation of the wire but the number of pairs of layers may be very considerable, for example greater than 100. In the second example, the number of layers is 2598, which is why only the first example is represented to simplify the figures. Each pair of conductive layers 11, 12, 13 comprises an intercalary layer 110, 120, 130 made of a non-carbon material, in this case in this embodiment an electrically conductive metal and a graphene layer 111, 121, 131.

The first pair of layers 11 has its intercalary layer 110 enveloping the outer surface of the central core 10 and its graphene layer 111 enveloping the outer surface of the intercalary layer 110.

The second pair of conductive layers 12 comprises its intercalary layer 120 enveloping the outer surface of the graphene layer 111 of the first pair of conductive layers 11 and its graphene layer 121 enveloping the outer surface of the intercalary layer 120.

The third pair of conductive layers 13 comprises its intercalary layer 130 enveloping the outer surface of the graphene layer 121 of the second pair of conductive layers 12 and its graphene layer 131 enveloping the outer surface of the intercalary layer 130.

Thus each $N^{th}$ pair of layers from the second comprises its intercalary layer enveloping the graphene layer of the $N-1^{th}$ pair of layers (preceding pair of layers). In the second example, N is thus equal to 2598.

In this example, each intercalary layer 110, 120, 130 is here made of copper, but could be made of another conductive metal, such as iron or aluminium. The intercalary layers 110, 120, 130 of the pairs of layers 11, 12, 13 may be made of different conductive materials, for example the intercalary layer 130 of the final pair of layers 13 may be made of aluminium while the others 110, 120 are made of copper.

According to another embodiment, the intercalary layers are made of an electrically insulating material. In other words, in this other embodiment, each graphene layer 111, 121, 131 of each pair of layers 11, 12, 13 is separated from another graphene layer 111, 121, 131 of another pair of layers 11, 12, 13 by an intercalary layer 110, 120, 130 made of electrically insulating material which is deposited according to a method other than electrolysis, for example as for the graphene layer by CVD in another chamber.

In this embodiment represented, each graphene layer 111, 121, 131 of each pair of layers 11, 12, 13 is thus separated from another graphene layer 111, 121, 131 of another pair of layers 11, 12, 13 by an intercalary layer 110, 120, 130 made of conductive metal material.

In this embodiment represented, the second and the third intercalary layers 120, 130 make it possible to separate the second graphene layer 121 from respectively the first and third graphene layers 111, 131 to separate them and thus that they each conserve their thickness and their optimal properties, notably their conductivities. Further, the conductive material of the intercalary layers, here in this example copper, makes it possible to improve the overall conductivity of the multilayer electric wire 1.

In addition, graphene is a material having an electrical resistance temperature variation curve which compensates that of the metal of the intercalary layers 110, 120, 130, for example made of copper. Indeed, the higher the temperature of the intercalary layer 110, 120, 130, the more the electrical resistance of this layer will increase and the thermal conductivity of the graphene will make it possible to transfer and to evacuate heat from the intercalary layers 110, 120, 130 to the exterior. Finally, the great mobility of electrons in graphene enables the graphene layer 111, 121, 131 to improve the frequency response of the electric wire compared to that of an electric wire made of conductive metal. The mechanical strength of graphene makes it possible to reinforce the electric wire against tearing or cutting and thus makes it possible to protect the intercalary layers made of conductive metal. When the multilayer electric wire is used, the ends could be soldered, for example with tin, in order to improve the electrical conductivity of each layer with the connector connected to the wire.

The multilayer conductive wire 1 thus comprises a core 10 and a base of multilayers 123 comprising alternations, in this case here in this exemplary illustration three alternations and in the second example 2598 alternations of intercalary layers made of electrically conductive metal material 110, 120, 130 and graphene layers 111, 121, 131 each deposited on the intercalary layer of its pair of layers.

The section of the multilayer electrically conductive wire 1 is in this example of circular shape. The core 10 and each intermediate layer 110, 120, 130 and each graphene layer 111, 121, 131 have a section of circular shape. It will be appreciated that the section of the multilayer electrically conductive wire core may have another shape, for example rectangular.

In this example, the thickness of each intercalary layer 110, 120, 130 is identical, in this case around 10 nanometres, it may be less than this value. It will be appreciated that each intercalary layer 110, 120, 130 may have a thickness different from the other intermediate layers. The thickness, in this example, is measured between the inner diameter and the outer diameter of the intercalary layer 110, 120, 130. In the case of a section of rectangular shape, the thickness is measured between the inner wall and the outer wall.

In this example, the section of the intercalary layers 110, 120, 130 has a regular thickness. Regular thickness is taken to mean a thickness that does not vary by more than 10%. In these two examples, the intercalary layer is made of copper and comprises a thickness of 10 nanometres.

Each intercalary layer 110, 120, 130 made of conductive metal material is deposited by electrodeposition on a graphene layer or on the core for the first intercalary layer 110, 120, 130. In other words, each intercalary layer 110, 120, 130 comprises traces of deposition by electrodeposition.

The graphene layer may be monolayer (perfect 2D graphene), i.e. a thickness by definition of one atom, i.e. 0.3 nanometres, but may also be classed as a "few-layer graphene", i.e. in layers of 2 to 10 carbon atoms thickness as in the second example of which the thickness is around 2.5 nanometres.

According to another embodiment, the graphene layer has a thickness of 100 layers, called "graphene nanoplatelets".

Thickness of the intercalary or graphene layers is taken to mean the difference between the inner radius and the outer radius.

In the second example, the 2598 pairs of layers thus form 6% of the thickness of the conductive wire, which comprises an outer diameter of around 0.5 mm, i.e. 0.468+2598*(the intercalary layer having a thickness of around 10 nanometres+the graphene layer having a thickness of around 3 nanometres).

Such a multilayer electrically conductive wire makes it possible to have a weight saving of 61% compared to a copper conductive wire of same diameter for a same conductivity, i.e. here around 0.288 ohms/m.

In this embodiment, the multilayer electrically conductive wire 1 comprises a final outer layer of an electrical insulator 19. The electrical insulator 19 may be a polymer, for example an enamelling varnish or an insulating sheath for example made of elastomer (polyethylene (PE) for example) or a rubber (ethylene propylene rubber (EPR) for example).

According to another example, a cable comprises a plurality of this multilayer electrically conductive wire exempt of insulator 19. The insulator may be formed on the cable. The multilayer electrically conductive wires may also be twisted together by a conductor cabling method.

FIG. 2 represents a section of a multilayer electrically conductive wire 1' according to a second embodiment.

This multilayer electrically conductive wire 1' is different from that of the first embodiment uniquely in that it comprises a core 10' different from the core 10 of the first embodiment.

In this embodiment, the core 10 comprises two layers, an inner-core 100 made of electrical material, in this case copper, and a graphene layer 101 deposited on the inner-core 100. The multilayer electrically conductive wire 1' thus also comprises in this example a set of pairs of layers 123 or base of multilayers 123 of which the layers are coated one on the other forming the multilayer conductive wire 1', in this case three pairs of layers 11, 12, 13. The electric wire also comprises a layer of insulator 19 on the final graphene layer 131.

A second example of this embodiment, not represented, comprises a hundred or so pairs of layers.

These multilayer electrically conductive wires according to the invention are particularly interesting in electric machines of turbomachines or in the cable trays of an aircraft (airplane/helicopter). Several conductive wires according to one of the two embodiments described previously may be twisted together to form a cable.

The multilayer electrically conductive wires according to the invention, in particular the examples of that having a core made of carbon, notably carbon fibre or carbon nanotube fibre, are also particularly interesting for manufacturing a mesh of an airplane in particular those having a composite structure. Indeed, the mesh of airplane structures makes it possible to withstand the stresses of a lightning strike but increases the weight of the airplane and is often used for those made of composite decreasing the weight saving. Such a mesh, for example that of the multilayer electrically conductive wire comprising a core made of carbon, enables a weight saving compared to those made of thin copper wires for example integrated in the surface films.

FIG. 3 represents a production line 2, also called a production chain, for manufacturing the second example described of the multilayer electrically conductive wire 1 of the first embodiment, but could also manufacture the multilayer electrically conductive wire 1' of the second embodiment.

The production line 2 comprises a first coil 230, here in the unwinding sense, comprising the wound core 10 for the manufacture of the multilayer electrically conductive wire 1.

The method for manufacturing the multilayer electrically conductive wire 1 or 1' thus comprises a method for depositing pairs of layers of a conductive wire being manufactured comprising a step of unwinding a wire under construction comprising at least the central core 10, 10' from the first unwinding coil 230.

The production line 2 comprises a device for depositing a coating of an intercalary layer made of a non-carbon material, here the device is an electrodeposition device 20 comprising a bath of electrolytic solution 200, an anode electrode 201 made of metal to deposit for manufacturing the intercalary layer 110, 120, 130, the anode electrode 201 being situated in the bath 200. The electrodeposition device 20 further comprises a cathode electrode 202 to be electrically connected to the electrically conductive wire being manufactured. In this example, the production line 2 comprises a pulley forming the cathode electrode 202. Further in this example, the pulley has a number of tracks corresponding to the numbers of pairs of layers to produce by the method for depositing pairs of layers of a conductive wire being manufactured, in this case here the pulley is three track, i.e. three pairs of layers per method for depositing pairs of layers of a conductive wire being manufactured.

The core 10 enters into the bath of electrolytic solution 200 and being electrically connected to the pulley forming the cathode electrode 202, the metal of the anode electrode 201 migrates onto the portion of the core 10 in the bath forming an intercalary layer 110 on the core 10. The conductive wire being manufactured thus comprises a first portion 10110 which comes out of this bath of electrolytic solution 200 while having the core and an intercalary layer 110, in this case copper, deposited by electrodeposition by the electrodeposition device 20.

The bath of electrolytic solution 200 contains acid. This makes it possible to multiply the ions and thus the strength of the current brought into play during electrolysis. According to an example, the electrolyte comprises less than 75% of sulphuric acid.

The electrodeposition of the intercalary layer 110 on the carbon core 10 makes it possible to insulate the graphene layer 111 120, 130 of the core so that it retains its electrical, thermal and mechanical properties of graphene.

The production line 2 further comprises a device for chemical vapour deposition (CVD) of graphene 21 comprising a chamber 210.

The chamber 210 is in an embodiment under vacuum, for example less than 15 millibars or even in this example 0.6 millibars, to increase the rate of manufacturing the graphene layer.

The device for chemical vapour deposition (CVD) of graphene 21 comprises nozzles 211 injecting a gas comprising carbon, in this case methane, but it may be carbon dioxide, into the chamber 210.

The first portion 10110 of the conductive wire being manufactured enters into the device for chemical vapour deposition (CVD) of graphene 21, wherein a graphene layer 111 is deposited on the intercalary layer 110 forming the first pair of layers 11.

In this example, the device for chemical vapour deposition (CVD) of graphene 21 comprises a plurality of forwards-backwards pulleys 221, in this case five forwards-backwards pulleys 221 are represented, to increase the passages of the conductive wire being manufactured in the chamber 210, in this case six passages in the chamber 210, to produce the graphene layer.

The manufacturing time of the graphene layer compared to that of the electrolysis time is in this example longer. In this example, the back and forth movements by the different pulleys enable that the ratio of the length of wire in the chamber of the device for chemical vapour deposition 21 of graphene during deposition of the graphene layer 111 over the length of the wire in the chamber of the device for depositing a coating 20 during deposition of the intercalary layer 110 is equal to the ratio of the production time of the graphene layer (takt time) over the production time of the intercalary layer (takt time) by the device for depositing a coating 20. Thus, production is continuous while adapting to the production time of the intercalary layer (takt time), notably if this is carried out by electrolysis. Indeed, the electrodeposition of the intercalary layer on the graphene layer at iso-length is faster than chemical vapour deposition (CVD) of the graphene layer on the intercalary layer.

The conductive wire being manufactured comes out after the final passage in this chamber 210 with a graphene layer 111 forming a portion 1011 comprising the core 10 and the first pair of layers 11.

This portion 1011 of the conductive wire being manufactured is immersed in the bath of electrolytic solution 200 of the electrodeposition device 20 to form the second intercalary layer 120 and comes out in the form of a portion 10120 of the conductive wire. This portion 10120 enters into the chamber 210 in which is formed the second graphene layer by the chemical vapour deposition (CVD) device to form a portion 1012 comprising the second pair of layers 12 of the multilayer conductive wire 1.

The electrodeposition of the intercalary layer 120, 130 on the graphene makes it possible to isolate the two graphene layers 111-121 or the two graphene layers 121-131 easily without deterioration.

The multilayer conductive wire 1 having in this case three pairs of layers, the portion 1012 is immersed in the bath of electrolytic solution 200 of the electrodeposition device 20 and in the chamber of the chemical vapour deposition (CVD) device to form a portion 1013 comprising the third pair of layers 13 of the conductive wire.

The conductive wire is next led by means of a pulley 228 to a second coil 231 by a winder/unwinder device driving the winding of the second coil by an electric motor to draw the conductive wire being manufactured.

The method for manufacturing the second example of the multilayer electrically conductive wire according to the first embodiment comprises several successions of the method for depositing pairs of layers of a conductive wire being manufactured. Here, the method for depositing pairs of layers of a conductive wire being manufactured is reversible. Reversible is taken to mean that when the step of winding of the second coil is finished, the method for depositing pairs of layers functions in a second reversible direction (second way) and comprises a step of unwinding the conductive wire 1+ being manufactured from the second coil 231, depositing at least two successive pairs of layers on the conductive wire being manufactured around the central core and winding the conductive wire being manufactured simultaneously onto the first coil. Thus, the method for depositing pairs of layers in a first direction from the first coil to the second coil can also begin on a conductive wire being manufactured comprising pairs of layers around the core.

In this example, the production line 2 further comprises a second device for depositing a coating 28 of an intercalary layer made of a non-carbon material to form an intercalary layer on the portion 1013 comprising the third pair of layers 13 of the conductive wire. The conductive wire under construction 1+ coiled on the second coil thus comprises this intercalary layer forming part of a pair of layers which will be completed by the production line 2 in the opposite direction, that is to say from the second coil to the first coil.

In this manufacturing example, the conductive wire being manufactured is thus drawn Y times in the first direction of production and Y times in the second reversible direction of production. In the first direction, the wire is drawn from the first coil 230 to and by the second coil 231 and in the second reversible direction, from the second coil 231 to the first coil 230. In each direction of production the wire passes X times in the bath 200, in this case 3 times, and in the chamber 210. In the first direction the wire passes X times in alternation in the bath and the chamber and thereafter in the second device for depositing a coating 28, and in the other direction in the second device for depositing a coating 28 then X times in alternation in the chamber 210 and the bath 200, X times Y being the number of pairs of layers of the wire to manufacture.

The second device for depositing a coating 28 only operates in one direction for manufacturing an intercalary layer between the two graphene layers. The production line 2 thus comprises a first device for winding/unwinding from the first coil 230 to unwind in a first direction and to wind by drawing the conductive wire under construction in the second reversible direction and a second device for winding/unwinding from the second coil 231 to wind/unwind in the first and second directions.

In the first manufacturing direction, when the first coil 230 is wound with the conductive wire being manufactured comprising several pairs of layers, i.e. the method doubles the intercalary layer two times by re-passing a second time successively in the electrodeposition device 20, i.e. the pulley 2201 comprises a moveable track being able to rise and descend in order to enter or come out of the bath 200 in order to avoid two successive intercalary layers without graphene layer.

FIG. 5 represents another example of production line 2' for the manufacture of the first example of the multilayer electrically conductive wire 1 according to the first embodiment, but may also be for the manufacture of the first example of the multilayer electrically conductive wire 1' according to the second embodiment. The production line 2' is identical to that of the production line 2 and thus comprises a number of tracks corresponding to the number of pairs of layer of the electrically conductive wire 1, 1' except in that it comprises in the place of this second device, a device for depositing insulator 29. The device for depositing insulator 29 is for example an extruder of a plastic, to form the final insulating layer 19 of the multilayer conductive wire 1 wound on the second coil 231. The method comprises in this example, after the step of deposition carried out following the first sub-step and the second sub-step X times, a step of depositing the insulator 19 on the final graphene layer 131 and finally a step of coiling by the winder coil 231.

For example, the conductive wire is drawn by the second coil 231 from the first coil 230 while passing X times in the bath 200, in this case 3 times, and in the chamber 210 thereafter up to the device for depositing insulator 29, X being the number of pairs of layers.

The method for manufacturing the multilayer electrically conductive wire 1 or 1' according to the first example of this embodiment, thus comprises Y=1 times the method for depositing pairs of layers of a conductive wire being manufactured comprising a step for depositing a multilayer base comprising at least X>two pairs of successive layers 11,12, 13, in this case X=three, around the core 10, 10' of the conductive wire being manufactured to form the multilayer conductive wire 1,1'.

According to the different methods, the deposition step thus comprises X times a first sub-step of continuous immersion of a portion 10, 1011, 1012 of the conductive wire in the bath of electrolytic solution 200, in which a metal, in this case copper, migrates and is deposited on the outer surface of the conductive wire under formation to form the intercalary layer, and X times a second sub-step following the first sub-step of continuous insertion of a portion 10110, 10120, 10130 comprising on the outer surface the intercalary layer 110, 120, 130 deposited in the preceding first sub-step, in the chamber 210 for chemical vapour deposition (CVD) of graphene in which gas comprising carbon is introduced so that a graphene layer 111, 121, 131 is deposited on the outer surface of the intercalary layer 110, 120, 130. In this example, the second sub-step comprises six successive entries of the portion of the conductive wire in the chamber 210 for chemical vapour deposition (CVD) to form a graphene layer 111, 121, 131. A section of multilayer conductive wire 1 being manufactured comprising three pairs of layers is thus entered in this example three times six times successively in the chemical deposition chamber 210, i.e. eighteen times.

In this case, in the example of the machine represented, the number of pairs of layers is three per method for depositing pairs of layers of a conductive wire being manufactured. To realise the second example of the conductive wire comprising 2598 pairs of layers, the method for manufacturing the second example of the multilayer electrically conductive wire comprises 866 methods for depositing pairs of layers of a conductive wire being manufactured, i.e. 433 methods for depositing pairs of layers in the direction from the first coil to the second coil and 433 methods for depositing pairs of layers in the reversible direction from the second coil to the first coil (Y is thus equal to 433).

According to an example, the intercalary coating device of the second device for depositing a coating 28 manufactures the intercalary layer according to the same coating deposition method as the first device, i.e. a copper layer by electrolysis.

The step of deposition may also comprise a sub-step of evaporation of the electrolytic solution from the outer surface of the intercalary layer 110, 120, 130 of the portion 10110, 10120, 10130 of the conductive wire being manufactured coming out of the bath 200 before being inserted into the chemical vapour deposition chamber 210.

The deposition step may also further comprise a sub-step of cleaning the outer surface of the intercalary layer 110, 120, 130 of the portion 10110, 10120, 10130 of the conductive wire being manufactured coming out of the bath 200 before being inserted into the chemical vapour deposition chamber 210. For example, the production line may comprise a cleaning bath between two pulleys 2221 making it possible to guide the portions 10110, 10120, 10130 from the bath 200 to the chamber 210.

The method may also comprise a step of manufacturing the core 10' of the second embodiment by running a conductive inner-core 100, in this case made of copper, in the chamber 210 of the device for chemical vapour deposition (CVD) of graphene 21 for manufacturing the graphene layer 101.

According to another example, the intercalary layers are made of aluminium. In this case the anode electrode 201 is made of aluminium. According to another example, the intercalary layers are made of iron. In this case the anode electrode 201 is made of iron.

The electrodeposition device 20 may comprise two or three baths of electrolytic solution 200 of two or three different metals to make it possible to produce layers of different metals in a same conductive wire, for example a copper or aluminium or iron/a graphene layer/an aluminium intercalary layer or copper or iron/a graphene layer intercalary layer.

FIG. 4 represents a schematic diagram of an apparatus 3 comprising the production line 2 under vacuum during manufacture of a multilayer electrically conductive wire 1++ in the second direction to form the multilayer electrically conductive wire 1 or 1' according to the second example. The apparatus 3 comprises a vacuum pump 30 and a negative pressure chamber 33 comprising a pressure less than 10 millibars by the vacuum pump, in this case here 0.6 millibars, the production line 2 being housed in the negative pressure chamber 33. Further, the machine 3 comprises an exhaust hood 32 traversing the negative pressure chamber 33 up to the surface of the bath of electrolytic solution 200 to draw off the gases produced by the electrodeposition device 20 during electrolysis and another tube up to bath of the second coating device 28 for also drawing off (suck up) gases therefrom.

Such an apparatus makes it possible to have a chamber 210 under vacuum while minimising input and output leaks of the conductive wire being manufactured to improve the deposition of graphene.

FIG. 5 also represents this apparatus 3' identical to that of FIG. 4 except in that the exhaust hood 32 only draws off the gases from the bath 200 and in that the second coating device 28 is replaced by the insulator deposition device 29.

According to another example, an apparatus is identical to the apparatus 3' except in that the device for chemical vapour deposition (CVD) of graphene 21 comprises a vertical wall in the chamber 210 separating the final path from the other paths of the wire being manufactured, thus making it possible to use in the apparatus 3 the method for depositing pairs of layers of a conductive wire being manufactured in the reversible direction and to not use the vaporisation nozzles in the final path corresponding to the first path in the reversible direction so as not to produce two graphite layers one on the other.

FIGS. 6 and 7 represent another apparatus 3" according to another embodiment, different from the other apparatuses in that the device for depositing a coating of non-carbon based intercalary layers is a device for chemical vapour deposition (CVD) of the non-carbon based material. The apparatus 3" comprises in this example two chemical vapour deposition (CVD) devices, 20" and 21".

The apparatus 3" comprises, as in the other apparatuses of FIGS. 4 and 5, a vacuum pump 30", a negative pressure chamber 33" comprising a pressure less than 10 millibars by the vacuum pump 30", here in this case 0.6 millibars, and a production line 2" in the negative pressure chamber 33". The production line 2" also comprises, as in those described previously, a first coil 230 and a second coil 231, a first winding/unwinding device of the first coil 230 for unwinding/winding in a respectively first/second direction and a second winding/unwinding device of the second coil 231 for winding/unwinding in the first/second direction and a final pulley 228.

In this example, the first and the second chemical vapour deposition devices 20", 21" are identical to the device for chemical vapour deposition of graphene 21, 21' of the other apparatuses 2, 2' except in that they can change the gas projected into the chamber 200", 211" thereof.

For example, in the first direction, represented in FIG. 6, from the first coil 230 to the second coil 231, the first chemical vapour deposition device 20" vaporises in its chamber 200" by its nozzles 201" a gas comprising non-carbon based material, for example silicon oxide (SiOx). Silicon oxide makes it possible to lighten the wire, indeed it is between 11 and 35 times lighter than copper and further is more flexible. A carbon/graphene wire produced with this type of intercalary material makes it possible to be 20% lighter than with the example of copper intercalary layer and five times lighter than a solid copper wire (without multilayers).

The intercalary layers made of silicon oxide (SiOx) are thus vaporised in the chamber 200" to be deposited on the core 10 or on the graphene layer of the portion of the wire [1011, 1012, 101(x–1), . . . i11x (produced in the second direction), i011, i012, i01(x−1)] (x being the number of pairs of layers produced during a winding of the second coil, i.e. the number of paths of the pulleys 220", 221", in this case here 3 but could be more (representation by dotted lines) and i the number of uses of the production line in the first direction of the production line for producing the wire) and thus to form the intercalary layer of a portion of wire [10110, 10120, 10130, 101x0 . . . i0110, i0120, i01x0] and the second chemical vapour deposition device 21" vaporises in its chamber 210" by its nozzles 211" a gas comprising graphene to be deposited on the intercalary layer of the portion or wire [10110, 10120, 10130, 101x0 i0110, i0120, i01x0] to form the graphene layer of the portion of wire [1011, 1012, 101x . . . , i011, i012, i01x].

In the second direction represented in FIG. 7, from the second coil 231 to the first coil 230, the second chemical vapour deposition device 21" vaporises in its chamber 210" by its nozzles 211" a gas comprising non-carbon based material to be deposited on the graphene layer of the portion of wire 101(x) (produced in the first direction),1111, 1112, 111(x−1) . . . i01x, i111, i112, i11(x−1)] and thus form the intercalary layer of a portion of wire [11110, 11120, 11130, 111x0 . . . i1110, i1120, i1130, i11x0] and the first chemical vapour deposition device 21" vaporised in its chamber 210" by its nozzles 211" a gas comprising graphene to be deposited on the layer of non-carbon based material of the portion of wire [11110, 11120, 11130, 111x0 . . . i1110, i1120, i1130, i11x0] to form the graphene layer of the portion of wire [1111,1112, 111(x−1), 111x . . . 011, i112, i11(x−1), i11(x)].

Other examples of multilayer conductive wires may stem from this invention while other production lines or apparatuses may be used, for example the multilayer conductive wire may be exempt of the insulating layer to form for example a cable and thus the production line is exempt of the device for depositing insulator 29 or instead this insulating layer 19 may be produced outside of the apparatus 3 by unwinding the coil 231.

Unless stated otherwise, a same element appearing in the different figures has a single reference.

The invention claimed is:

1. A multilayer electrically conductive wire comprising:
a central support core;
a set of pairs of layers around the central support core each comprising at least one intercalary layer made of a non-carbon based material and a graphene layer, wherein a first layer of a first pair of layers is deposited on an outer surface of the central support core enveloping the outer surface of the central support core and a first layer of a N+1th pair of layers is deposited on a second layer of a Nth pair of layers, in such a way as to separate each graphene layer from another graphene layer by one of the intercalary layers, wherein the non-carbon based material of each intercalary layer is an insulating material, and wherein each graphene layer is made using a chemical vapor deposition method, and the ends of the conductive wire are soldered such that all the graphene layers are electrically connected in parallel, wherein the insulating material of at least one intercalary layer is made of silicon oxide (SiOx).

2. The multilayer electrically conductive wire according to claim 1, wherein the graphene layer of each pair of layers is derived from a pulsed chemical vapour deposition (CVD) method, optionally pulsed.

3. The multilayer electrically conductive wire according to claim 1, wherein the central support core is made of carbon.

4. The multilayer electrically conductive wire according to claim 3, wherein the central support core is made of carbon fiber.

5. The multilayer electrically conductive wire according to claim 1, wherein the central support core further comprises:
an electrically conductive metal inner-core portion,
a graphene layer deposited on the conductive inner-core portion, wherein the intercalary layer of the first pair of layers coats the graphene layer.

6. The multilayer electrically conductive wire according to claim 5, wherein the electrically conductive metal inner-core is made of copper.

7. A method for manufacturing a multilayer electrically conductive wire comprising a central support core, a set of pairs of layers around the central support core each comprising at least one intercalary layer made of a non-carbon based material and a graphene layer, wherein a first layer of a first pair of layers is deposited on an outer surface of the central support core enveloping the outer surface of the central support core and a first layer of a N+1th pair of layers is deposited on a second layer of a Nth pair of layers, in such a way as to separate each graphene layer from another graphene layer by one of the intercalary layers, wherein the non-carbon based material of each intercalary layer is an insulating material, and wherein each graphene layer is made using a chemical vapor deposition method, the method comprising:
continuously unwinding a conductive wire under construction comprising the central support core from a first coil,
depositing at least two successive pairs of layers around the central support core, comprising for each deposition of a pair of layers:
a first sub-step of inserting the conductive wire under construction into a device for depositing a coating of an intercalary layer made of a non-carbon based material,
a second sub-step of continuously inserting a portion of the conductive wire comprising the outer surface intercalary layer deposited in the preceding first sub-step, into a chamber for chemical vapour deposition (CVD) of graphene into which gas comprising carbon is introduced and in which is deposited a graphene layer on the outer surface of the intercalary layer,
winding the multilayer conductive wire having at least two pairs of layers around a second coil,
wherein the method of manufacturing comprises repeating the depositing at least two successive pairs of layers a plurality of times and, wherein the method for depositing pairs of layers of a conductive wire being manufactured is reversible, and wherein when each step of winding the second coil is finished, the reversible method for depositing pairs of layers of a conductive wire being manufactured comprises a step of unwinding the conductive wire from the second coil, the step for depositing at least two successive pairs of layers around the central support core and winding the conductive wire being manufactured simultaneously on the first coil;
as a final step, soldering ends of the conductive wire to place all the graphene layers electrically in parallel.

8. The multilayer electrically conductive wire according to claim 1, wherein the chemical vapor deposition method is a pulsed chemical vapor deposition method.

* * * * *